United States Patent [19]

Hosokawa et al.

[11] Patent Number: 5,422,511
[45] Date of Patent: Jun. 6, 1995

[54] IMAGE SENSOR UTILIZING PHOTO DIODE, BLOCKING DIODE AND CLAMPING DIODE

[75] Inventors: Yoichi Hosokawa, Hyougo; Tadashi Obayashi, Shiga; Shinichiro Kurata, Shiga; Satoru Murakami, Shiga; Hiromi Maeda, Kyoto; Takeharu Yamawaki, Shiga, all of Japan

[73] Assignee: Kanegafuchi Kagaku Kogyo Kabushiki Kaisha, Osaka, Japan

[21] Appl. No.: 973,308

[22] Filed: Nov. 9, 1992

[30] Foreign Application Priority Data

Nov. 9, 1991 [JP] Japan .................... 3-321058

[51] Int. Cl.⁶ ................................ H01L 27/14
[52] U.S. Cl. ........................ 257/443; 257/53
[58] Field of Search ............ 257/448, 443, 53

[56] References Cited

U.S. PATENT DOCUMENTS

| | | | |
|---|---|---|---|
| 3,551,761 | 12/1970 | Ruoff et al. | 257/443 |
| 4,496,834 | 1/1985 | Nanba et al. | 257/53 |
| 4,826,777 | 5/1989 | Ondris | 257/53 |

FOREIGN PATENT DOCUMENTS 0032570 2/1986 Japan .................... 257/448

Primary Examiner—Robert P. Limanek
Assistant Examiner—Alexander Oscar Williams
Attorney, Agent, or Firm—Cushman, Darby & Cushman

[57] ABSTRACT

The invention seeks to reduce residual image in the vertical direction, which is the most significant drawback in the charge storage system, and further to permit increased speed of operation to be obtained.

To this end, an image sensor of matrix drive type according to the invention comprises m by n diode pairs each including a photo- and a blocking diode PD and BD with the cathode electrodes thereof connected in series, the diode pairs constituting n blocks $B_1, B_2 \ldots, B_n$ each of m diode pairs. A clamp diode CD is connected to the juncture between the photo- and blocking diodes PD and BD in each diode pair to clamp the potential on the juncture and thus permit complete and quick charging of the capacitance of the photo-diode PD.

8 Claims, 13 Drawing Sheets

IMAGE SENSOR UTILIZING PHOTO DIODE, BLOCKING DIODE AND CLAMPING DIODE

BACKGROUND OF THE INVENTION

This invention relates to image sensors and, more particularly, to improvements in charge storage type image sensors.

Recently, image sensors of close contact type, which lead originals in the same scale, are adopted for original reading sections of facsimile and like systems in place of CCD type image sensors requiring contracting optical systems. The close contact type image sensor comprises a number of photo-diodes, which are formed in a unidimensional arrangement on an insulating substrate of glass or the like and comprise a thin semiconductor film of amorphous silicon a-Si. Usually, this type of image sensor adopts a matrix drive system for reading out signals from the photo-diodes sequentially in block-by-block reading.

FIG. 12 shows a prior art matrix drive system image sensor. This image sensor comprises in an array m by n diode pairs each including a photo- and a switching blocking diode PD and BD with the cathode electrodes thereof connected in series. The blocking diodes BD have their anode electrodes connected commonly in the individual blocks $B_1, B_2, \ldots, B_n$ by respective block leads $A_1, A_2, \ldots, A_n$. The photo-diodes PD have their like electrodes in the individual blocks $B_1, B_2, \ldots, B_n$ connected commonly by respective channel leads $C_1, C_2, \ldots, C_m$.

This image sensor is based on a commonly termed charge storage system for its operation. As shown in the time chart of FIG. 13, drive pulses $V_{p1}, V_{p2}, \ldots, V_{pn}$ are applied sequentially to the respective blocks $B_1, B_2, \ldots, B_n$. In response to the application of these drive pulses, photo-currents $I_{o1}, I_{o2}, \ldots, I_{om}$ corresponding to stored light signals are caused to flow into the photo-diodes PD in the individual blocks $B_1, B_2, \ldots, B_n$ through the channel leads $C_1, C_2, \ldots, C_m$ to be processed by integration, amplification and so forth in a signal processing circuit (not shown), thus obtaining an image signal.

This operation will be described in greater detail in connection with one diode pair.

As shown in FIG. 14, the anode electrode of the photo-diode PD in the diode pair is connected through one of the channel leads $C_1, C_2, \ldots, C_m$ to an input terminal of the signal processing circuit. Usually, it is thus held at zero potential. When a drive pulse Vp is applied such as to bias the blocking diode BD forwardly and bias the photo-diode PD reversely as shown in FIG. 15, the capacitance of the photo-diode PD starts to be charged, causing the potential Vj at the juncture between the photo- and blocking diodes PD and BD (hereinafter referred to as mid point potential) to increase toward the drive pulse voltage Vp.

When the application of the drive pulse Vp is ended, the blocking diode BD is in a reversely biased state, and the capacitance of the photo-diode PD is gradually discharged by photo-current generated according to incident light intensity and the mid point potential is gradually decreasing. Denoting the interval of the drive pulses Vp (hereinafter referred to as storage time) by T and the photo-current generated according to the incident light intensity by Ip, the charge $\Delta Q$ which is discharged during the storage time T is given as $$\Delta Q = I_p \cdot T$$

Further, denoting the capacitance of the photo-diode PD by C, the change a $\Delta$ in the mid point voltage Vj is given as $$\Delta V = \Delta Q / C = I_p \cdot T / C$$

When the next drive pulse Vp is applied, the capacitance of the photo-diode PD starts to be charged again, causing the mid point potential Vj to increase toward the voltage Vp. At this time, a charging current is caused to flow through the photo-diode PD to make up for the charged $\Delta Q$. Through time integration of this charging current, an electric signal corresponding to the photo-signal stored in the photo-diode PD during the storage time T can be obtained as an image signal.

The changes in the mid point potential Vj include level change currents generated due to the capacitances of the photo- and blocking diodes PD and BD at the time of the rising and falling of the drive pulses Vp, as shown in FIG. 15. These level change currents are canceled as much as possible by making the falling of a drive pulse Vp for each of the blocks $B_1, B_2, \ldots, B_n$ and the rising of the next drive pulse Vp for the next block coincide in timing.

While this image sensor is comparatively simple in construction, it has the following drawbacks.

In the first place, it is difficult to obtain high speed operation. For allowing high speed operation, it is necessary to secure sufficient magnitude of the forward current in the blocking diode BD, and hence the forward voltage Vf applied thereto, so as to permit quick charge of the capacitance of the photo-diode PD. The forward voltage Vf applied to the blocking diode BD is given as $$V_f = V_p - V_j$$

Meanwhile, for obtaining substantially complete charging of the capacitance of the photo-diode PD which is made to discharge by the photo-current Ip, it is necessary to wait for the mid point potential Vj to reach substantial Vp. However, the forward voltage Vf is reduced substantially to zero by the time when the application of the drive pulse Vp is ended. In addition, when the illumination intensity of original read out is low, at which time the incident light intensity is low, the voltage change $\Delta V$ is small. In this case, the forward voltage Vf is already low in an initial stage of application of the drive pulse Vp. This means that prolonged operation is dictated under low illumination intensity.

A second drawback is that residual image is produced in the vertical direction. As noted above, for obtaining substantially complete charging of the capacitance of the photo-diode PD discharged by the photo-current Ip, it is necessary to wait for the mid point potential Vj to reach substantial Vp. This requires a considerably long duration of the drive pulse Vp, which is infeasible. In practice, the charging is discontinued at a certain timing. Therefore, in case of a change in the original state from white to black as shown in FIG. 16, in spite of the reading of black original a charging current cause the mid point potential Vj to be increased by $\Delta V_{res}$. In consequence, a residual image is generated in the vertical direction.

The above drawbacks are fatal problems inherent to the charge storage system, and various measures have been proposed. However, such measures are mostly complicated in structure, and those feasible for use are scanty.

The inventors, accordingly, conducted extensive researches and investigations in order to solve all the above problems and provide an image sensor, which operates at high speed, is free from residual image and is inexpensive. The invention is completed as a result of these researches and investigations.

BRIEF SUMMARY

According to one aspect of the invention, there is provided an image sensor, which comprises m by n diode pairs each including a photo- and a blocking diode with like electrodes thereof connected to each other, the diode pairs constituting n blocks each of m diode pairs, the electrodes of the diodes of one kind other than those connected to the diodes of the other kind being connected commonly in the individual blocks, the electrodes of the diodes of the other kind than those connected to the diodes of the afore-said one kind being such that like electrodes in the individual blocks are connected commonly, and clamping means for clamping the potential on the juncture between the photo- and blocking diodes in each diode pair.

In this image sensor, the clamping means is a clamp diode with an electrode thereof of the other kind than those constituting the juncture between the photo- and blocking diodes in each diode pair being connected to the juncture.

Further, in this image sensor the electrodes of the clamp diodes other than those connected to the junctures in the diode pairs of photo- and blocking diodes are all connected commonly.

Further, in the above image sensor the photo-, blocking and clamp diodes are all formed on a single insulating substrate.

Further, in the above image sensor the photo-, blocking and clamp diodes are all made of amorphous silicon.

According to a specific aspect of the invention, there is provided an image sensor, which comprises m by n diode pairs arranged in an array and each including a photo- and a blocking diode with the cathode electrodes thereof connected in series, the diode pairs constituting n blocks $B_1, B_2, \ldots, Bn$ each of m diode pairs, the blocking diodes having the anode electrodes thereof connected commonly in the individual groups by respective block leads $A_1, A_2, \ldots, An$, the anode electrodes of the photo-diodes in like positions in the individual blocks $B_1, B_2, \ldots, Bn$ being connected commonly by respective channel leads $C_1, C_2, \ldots, Cm$, and clamp diodes each having anode electrodes each connected to the juncture of the photo- and blocking diodes in each diode pair and the cathode electrodes connected commonly to a clamp lead.

According to another specific aspect of the invention, there is provided an image sensor, which comprises m by n diode pairs arranged in an array and each including a photo- and a blocking diode with the anode electrodes thereof connected in series, the diode pairs constituting n blocks $B_1, B_2, \ldots, Bn$ each of m diode pairs, the blocking diodes having the cathode electrodes connected commonly in the individual blocks by respective block leads $A_1, A_2, \ldots, An$, the cathode electrodes of the photo-diodes in like positions in the individual blocks being connected commonly by respective channel leads $C_1, C_2, \ldots, Cm$, and clamp diodes having the cathode electrodes each connected to the juncture of the photo- and blocking diodes in each diode pair and the anode electrodes connected commonly by a clamp lead.

According to a further specific aspect of the invention, there is provided an image sensor, which comprises a photo-, a blocking and a clamp diode all formed on a single insulating substrate, the diodes each having an electrode, an amorphous silicon layer having the same structure and a transparent electrode formed on the outermost sub-layer of the amorphous silicon layer, the blocking, photo- and clamp diodes being arranged in the mentioned order substantially in a row, the cathode electrodes of the photo- and blocking diodes being connected together by an inner lead electrode, the cathode electrode of the clamp diode being connected via a different inner lead electrode to a clamp lead, the anode electrode of the photo-diode being connected through a contact hole formed in a transparent insulating film and via an outer lead electrode to a channel lead, the anode electrode of the blocking diode being connected via a different outer lead electrode to a blocking lead, the anode electrode of the clamp diode being connected via a further outer lead electrode to the inner lead electrode.

According to a still further aspect of the invention, there is provided an image sensor, which comprises a photo-, a blocking and a clamp diode all formed on a single insulating substrate, the diodes each having an electrode, an amorphous silicon layer having the same structure and a transparent electrode formed on the outermost sub-layer of the amorphous silicon layer, the clamp, blocking and photo-diodes being arranged in the mentioned order substantially in a row, the cathode electrode of the clamp diode being connected through a contact hole formed in a transparent insulating film and via an outer lead electrode to a clamp lead, the anode electrode of the clamp diode being connected via an inner lead electrode and a different outer lead electrode to the cathode electrodes of the photo- and blocking diodes, respectively, through respective contact holes, the anode electrode of the photo-diode being connected via a different inner lead electrode to a channel lead, the anode electrode of the blocking diode being connected via a further inner lead electrode to a blocking lead.

According to a yet further aspect of the invention, there is provided an image sensor, which comprises a photo-, a blocking and a clamp diode all formed on a single insulating substrate, the diodes each having an electrode, an amorphous silicon layer having the same structure and a transparent electrode formed on the outermost sub-layer of the amorphous silicon layer, the blocking, clamp and photo-diodes being arranged in the mentioned order substantially in a row, the anode electrode of the clamp diode being connected to an inner lead electrode formed underneath it as a con, non clamp lead, the cathode electrode of the clamp diode being connected through a contact hole formed in a transparent insulating film and via an outer lead electrode and a different inner lead electrode to the anode electrode of the photo-diode and also being connected via the outer lead electrode and a further inner lead electrode to the anode electrode of the blocking diode, the cathode electrode of the photo-diode being connected via a further outer lead electrode to a channel lead, the cathode electrode of the blocking diode being connected via a further outer lead electrode to a blocking lead.

In the above image sensors, drive pulses are applied sequentially to the photo- and blocking diodes for each block. However, since the potential at the juncture between the photo- and blocking diodes, i.e., a mid point potential, is clamped by the clamping means, preferably the clamp diode, the mid point potential is not changed to be above or below a certain fixed value.

For example, in a case, in which the photo- and blocking diodes have their cathodes connected to each other, the anode electrodes of the clamp diodes are connected to the junctures in the diode pairs, the anode electrodes of the blocking diodes are connected commonly in the individual blocks, and the like anode electrodes of corresponding channel photo-diode in the individual blocks are connected commonly, upon application of a drive pulse such as to bias the blocking diode in a diode pair forwardly and bias the photo-diode reversely, the capacitance of the photo-diode starts to be charged to cause the mid point potential to increase toward the drive pulse voltage. As a result, the voltage across the blocking diode is reduced gradually. However, the mid point voltage is not changed beyond a certain fixed value because it is clamped. Thus, the blocking diode voltage is not reduced to zero volt, therefore its certain fixed magnitude is secured. That is, a significant magnitude of charging current flowing into the photo-diode can be secured, and quick and complete charging of the capacitance of the photo-diode can be obtained.

When the application of the drive pulse is ended, the capacitance of the photo-diode is gradually discharged by the photo-current generated according to the incident light intensity, causing gradual reduction of the mid point potential. Upon application of the next drive pulse, charging current flows such as to make up for the charge, which is discharged by the photo-current. However, since a certain fixed magnitude of the blocking diode voltage is secured, the capacitance of the photo-diode is quickly charged again. Thus, even in case of low illumination intensity and hence low incident light intensity, the operation speed of the image sensor may be increased by reducing the duration and also the interval of the drive pulse. Further, the capacitance of the photo-diode is always in the completely charged state when it starts to be discharged by the photo-current, unlike the prior art there is no possibility of flowing charging current such as to make up for charge which could not have been charged with the preceding drive pulse. Thus, there is no possibility of production of any residual image in the vertical direction.

The above effects are also obtainable in a case, in which the anode electrodes of the blocking diodes are connected commonly in the individual blocks and the like anode electrodes of the photo-diodes in the individual blocks are connected commonly, and also in a case, in which the anode electrodes of the photo- and blocking diodes in each diode pair are connected to each other, and the cathode electrode of the clamp diode is connected to the junction in the diode pair.

The number m of the photo-, blocking or clamp diodes in each block and also the number n of blocks are not limited and may be any natural number.

With the provision in the image sensor according to the invention with the clamping means for clamping the potential on the juncture between the photo- and blocking diodes in each diode pair, the capacitance of the photo-diode can always be charged quickly and completely, thus permitting operation at high speed compared to that in the prior art case and also eliminating residual image in the vertical direction. Further, the illumination intensity of the original may be low, thus permitting the use of low illumination intensity and inexpensive light sources and such optical systems as lenses. Further, it is possible to provide for slightly strong shading compensation. According to the invention, the significant drawbacks inherent in the charge storage system thus can all be overcome by merely providing the clamping means.

Further, since the clamping means is a clamp diode with one electrode thereof of one kind connected to the other kind electrodes of the photo- and blocking diodes constituting the juncture, it is possible to obtain a structure, which is as simple as is comparable to that in the prior art. For example, by forming the clamp diodes on the insulating substrate, on which the photo- and blocking diodes are formed, an image sensor according to the invention can be manufactured easily and inexpensively by merely changing mask patterns or the like, and stable operation can be obtained. Further, by forming these photo-, blocking and clamp diodes with amorphous silicon simultaneously, an image sensor may be manufactured inexpensively. Further, of the clamp diodes those electrodes which are not connected to the junctures between the photo- and blocking diodes in the diode pairs, are all connected commonly, it is necessary to use only a single clamp voltage source, and thus a simpler construction can be obtained.

DETAILED DESCRIPTION OF THE INVENTION

Now, embodiments of the image sensor according to the invention will be described in detail with reference to the drawings.

Figure 1:
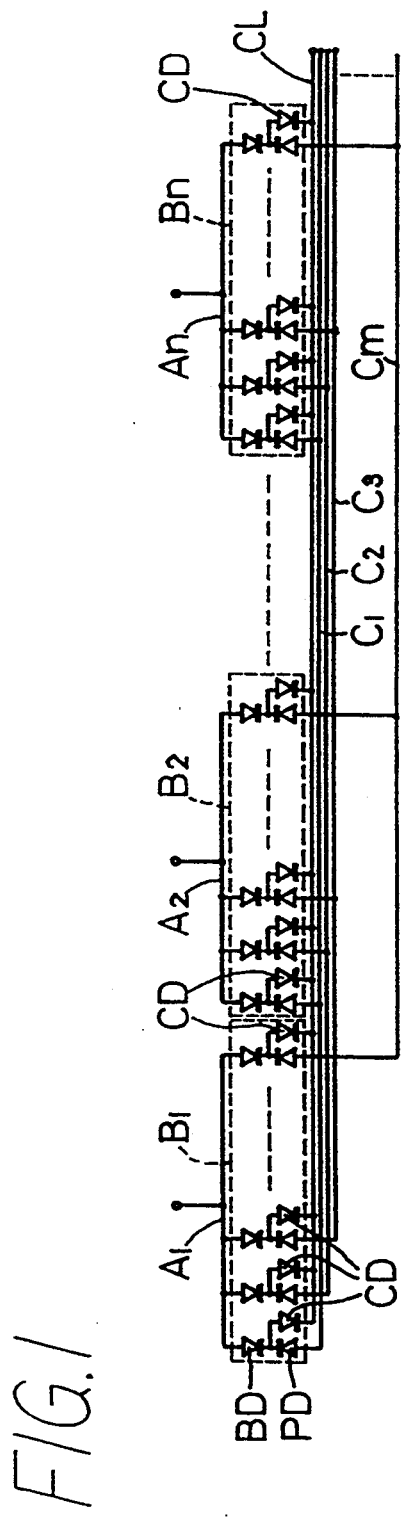
FIG. 1 is a connection diagram showing an embodiment of the image sensor according to the invention.

FIG. 1 is a connection diagram of an image sensor according to the invention. As shown, the image sensor comprises m by n diode pairs each including a photo- and blocking diode PD and BD with the cathode electrodes thereof connected in series. These diode pairs are arranged in an array constituted by n blocks $B_1, B_2, \ldots, B_n$ each of m diode pairs. The blocking diodes BD have their anode electrodes connected commonly in the individual blocks $B_1, B_2, \ldots, B_n$ by respective block leads $A_1, A_2, \ldots, A_n$. As for the photo-diodes PD, those in like positions in the individual blocks $B_1, B_2, \ldots, B_n$ have their anode electrodes connected commonly by respective channel leads $C_1, C_2, \ldots, C_m$. Further, in each diode pair a clamp diode (clamping means) CD has its anode electrode connected to the juncture between the photo- and blocking diodes PD and BD. These clamp diodes CD have their cathode electrodes connected commonly by a clamp lead CL.

Figure 2A:
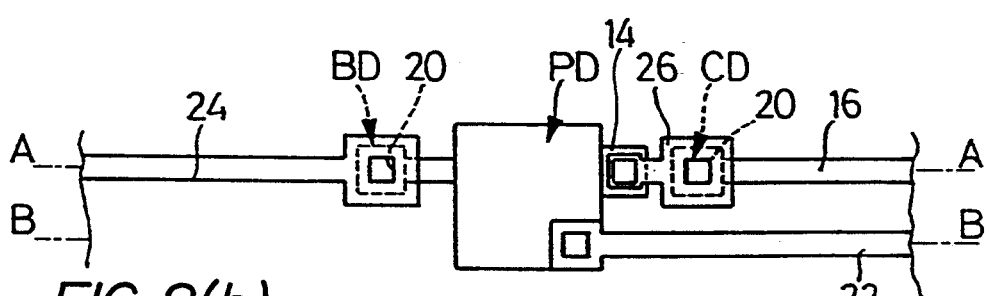
FIGS. 2(a) through 2(c) are schematics of a specific structure of the image sensor shown in FIG. 1, (a) being a plan view, (b) being a sectional view taken along line A—A in (a), and (c) being a sectional view taken along line B—B in (a)
Figure 2B:
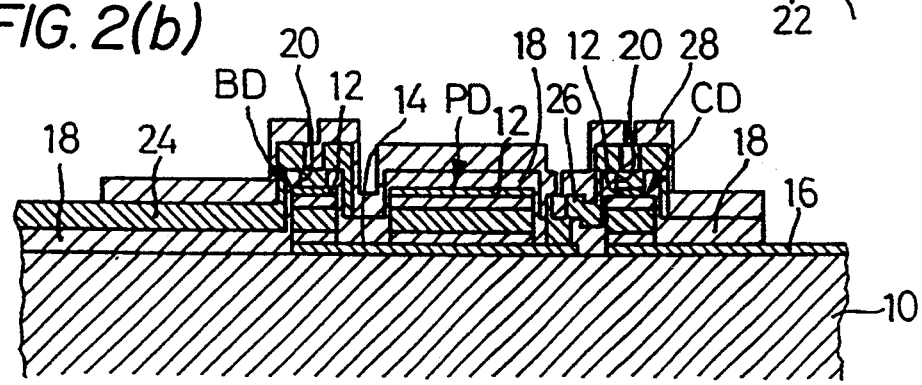
Figure 2C:
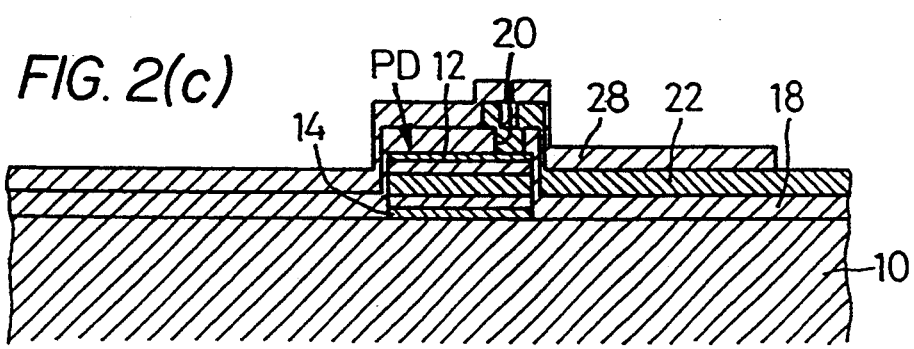

FIG. 2 shows a specific structure of the image sensor. As shown in (a) and (b) in FIG. 2, the photo-, blocking and clamp diodes PD, BD and CD are all formed on a single insulating substrate 10 and with like hydrated amorphous silicon a-Si:H. These diodes PD, BD and CD are formed in the order of the n-, i- and p-type from the surface of the insulating substrate 10 and each have a transparent electrode 12 formed on the uppermost layer. The photo- and blocking diodes PD and BD have their cathode electrodes connected together by an inner lead electrode 14. Each clamp diode CD has its cathode electrode connected to a clamp lead (not shown) by a separate inner lead electrode 16. The entire structure as described above is covered by a transparent insulating film 18, and contact holes 20 are formed at predetermined positions on the diodes PD, BD and CD. Further, as shown in (c), each photo-diode PD has its anode electrode connected through each contact hole 20 to an outer lead electrode 22, which is in turn connected to a channel lead (not shown). Each blocking diode BD has its anode electrode connected to a separate outer lead electrode 24, which is in turn connected to a blocking lead (not shown). Each clamp diode CD has an anode electrode connected to a further outer lead electrode 26, which is in turn connected to the lower lead electrode 14 noted above. The entire structure described above is covered by a transparent protective film 28 for such purposes as reliability improvement.

To manufacture such an image sensor, on an insulating substrate 10 of glass or the like (preferably "Coning #7059") a metal film of chromium Cr or the like is deposited by means of spattering to a thickness of about 1000 Å, then hydrated amorphous silicon a-Si:H is deposited by means of plasma CVD in the order of a n-, an i- and a p type layer to respective thicknesses of about 300, about 6,000 and about 300 Å, and then a transparent conducive film of ITO or the like is deposited by means of spattering to a thickness of about 650 Å. The transparent conductive film, hydrated amorphous silicon a-Si:H and metal film are then successively patterned by etching to form the transparent electrodes 12, photo-, blocking and clamp diodes PD, BD and CD and inner lead electrodes 14 and 16. On these elements, the transparent insulating film 18 of SiOx or the like is deposited by means of plasma CVD to a thickness of about 1 micron, and then it is patterned by etching and formed with contact holes at predetermined positions. Then, by means of spattering chromium Cr and aluminum Al are deposited to respective thicknesses of about 500 Å and about 1.5 microns, and they are patterned by etching in the order of aluminum Al and chromium Cr to form the outer lead electrodes 22, 24 and 26 having a two-layer structure. Then, the transparent protective film 28 of SiNx or the like is deposited by means of plasma CVD to a thickness of about 1 micron, and then patterned by etching. Thus, the image sensor is manufactured.

Figure 13:
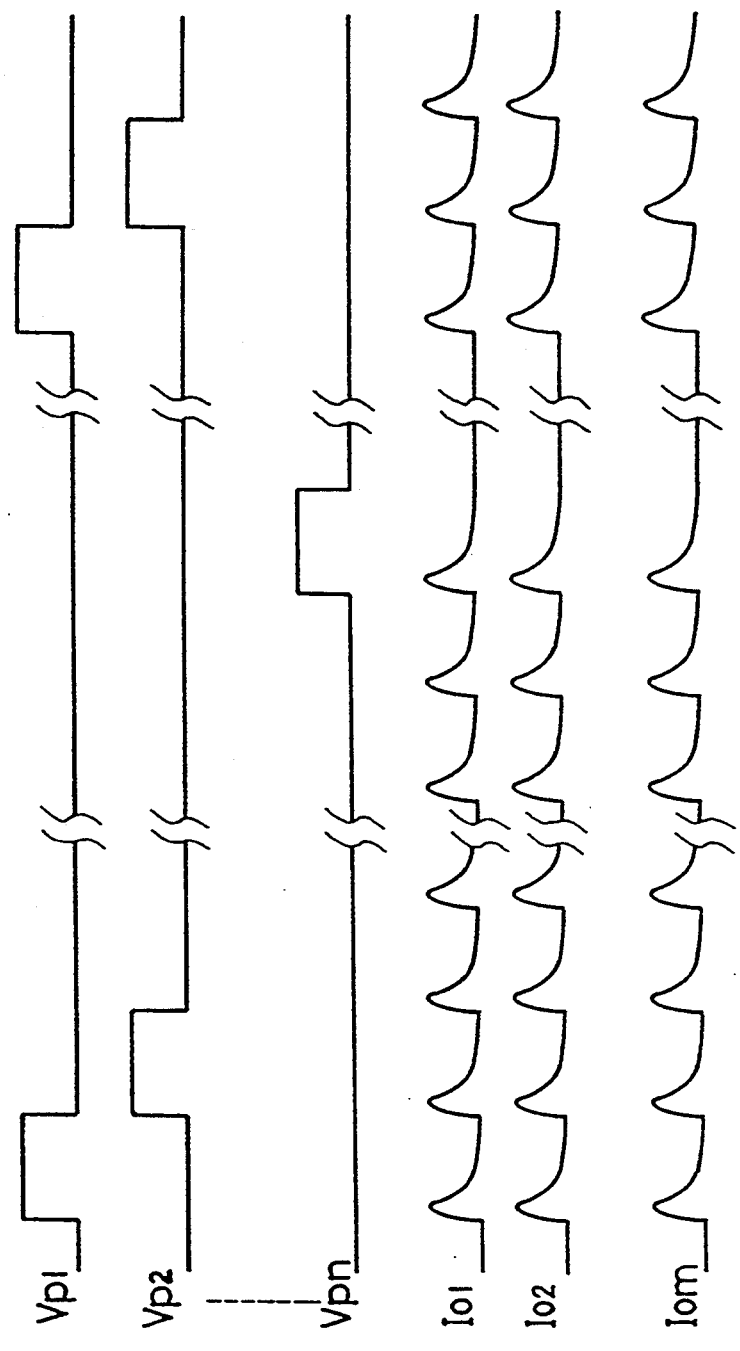
FIG. 13 is a time chart for explaining the operation of the image sensor shown in FIG. 12.
Figure 14:
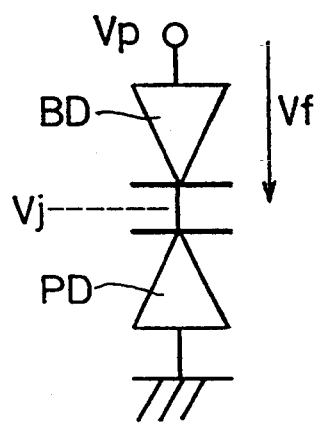
FIG. 14 is a connection diagram showing a part of the image sensor shown in FIG. 12 for explaining the operation.
Figure 15:
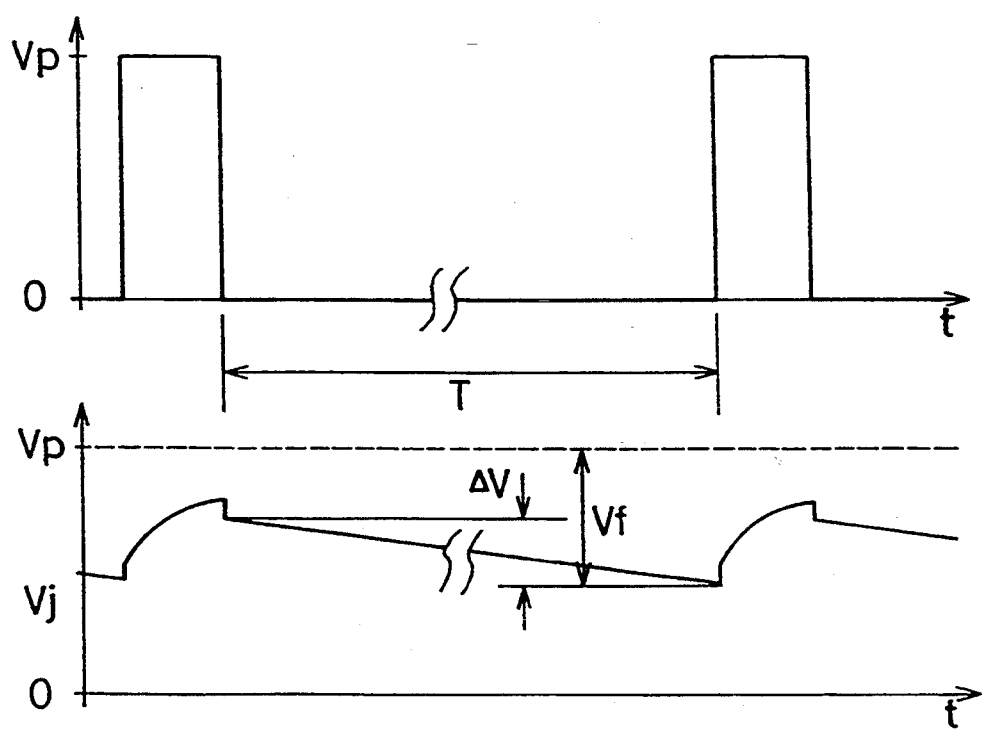
FIG. 15 is a time chart for explaining the operation of the image sensor part shown in FIG. 14.
Figure 16:
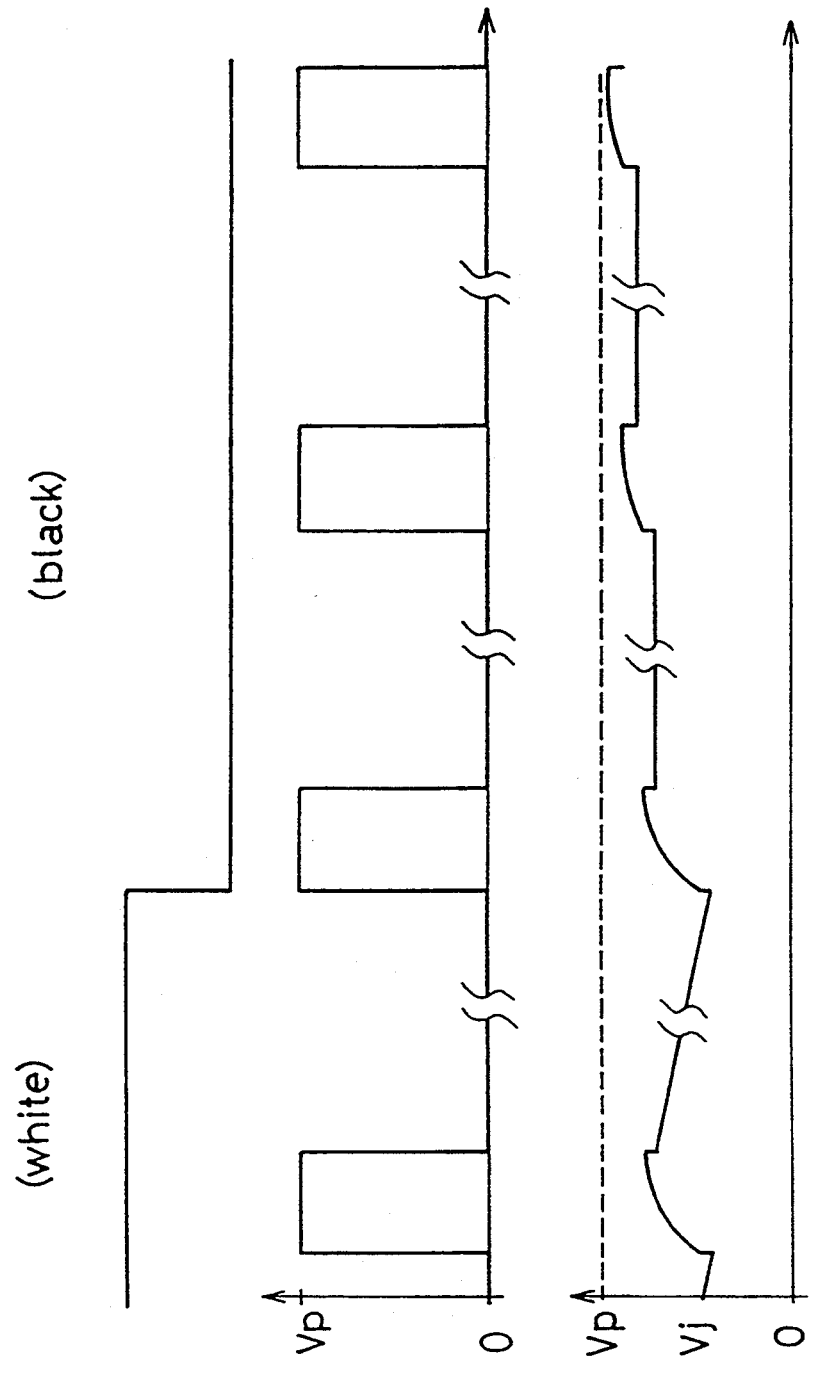
FIG. 16 is a time chart for explaining a problem of generation of residual image in the image sensor shown in FIG. 12, which is to be solved according to the invention.

This image sensor, like the case of diode pairs, is operated by the drive pulses Vp as shown in the time chart of FIG. 13. A series of operations involved will now be described in detail in conjunction with one set of the photo-, blocking and clamp diodes PD, BD and CD. As shown in the time chart of FIG. 13, the falling of a drive pulse Vp for one of the blocks $B_1, B_2, \ldots, B_n$ and the rising of the next drive pulse for the next block are made to be coincident in timing to cancel phase variation currents at the timing of the falling and rising of the drive pulses Vp as much as possible.

Figure 3:
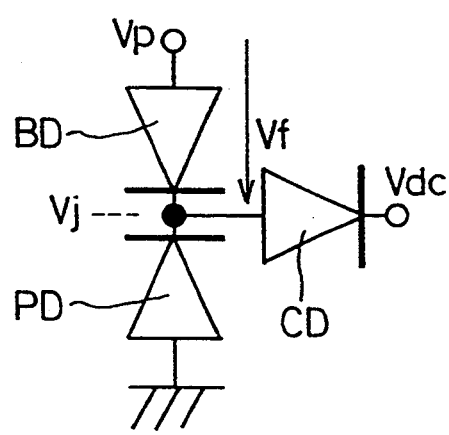
FIG. 3 is a connection diagram showing a part of the image sensor shown in FIG. 1 for explaining the operation.

As shown in FIG. 3, the photo- and blocking diodes PD and BD have their cathode electrodes connected together, and their juncture is connected via the clamp diode CD to a constant clamp voltage Vdc. The anode electrode of the photo-diode PD is connected via one of the channel leads $C_1, C_2, \ldots, C_m$ to an input terminal of a signal processing circuit and is imaginarily grounded.

Figure 4:
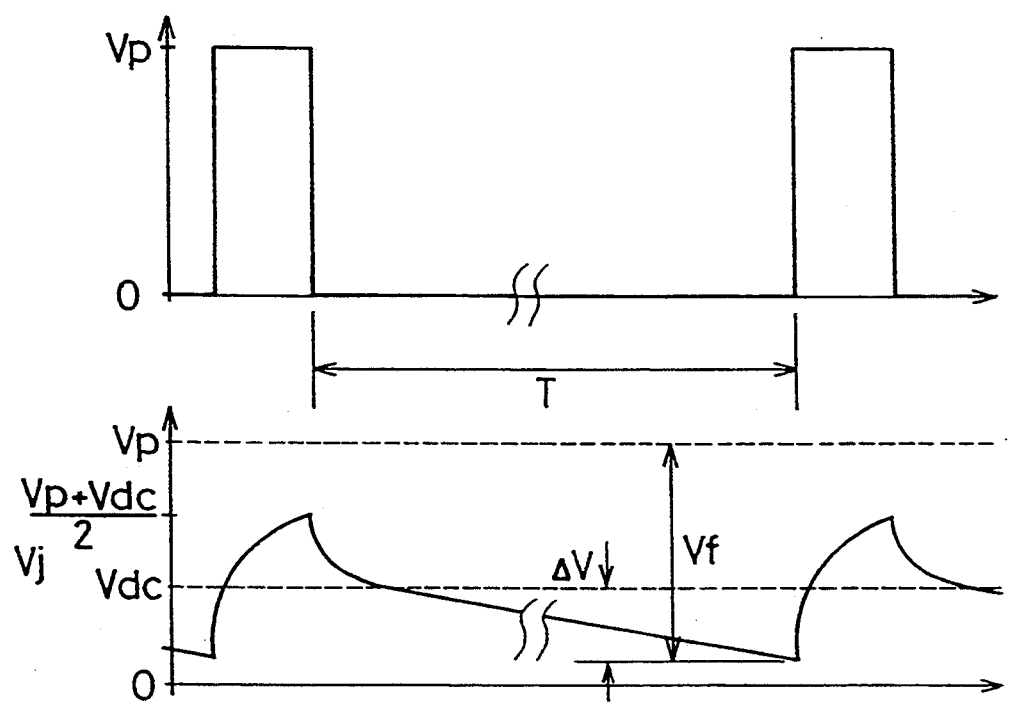
FIG. 4 is a time chart for explaining the operation of the image sensor part shown in FIG. 3.

As shown in FIG. 4, when a drive pulse Vp is applied such as to bias the blocking diode BD forwardly and the photo-diode PD reversely, charging of the capacitance of the photo-diode PD is started, causing the potential on the juncture between the photo- and blocking diodes PD and BD, i.e., mid point potential Vj, to be increased gradually toward the drive pulse voltage Vp. While the mid point voltage Vj is lower than the clamp voltage Vdc, no substantial current flows through the clamp diode CD because of the reverse bias there across, and the mid point potential Vj is increased gradually like the case of diode pairs. However, when the mid point voltage Vj becomes higher than the clamp voltage Vdc with the process of the charging, the clamp diode CD is now biased forwardly. Thus, the current in the blocking diode BD turns to flow partly through the clamp diode CD. Thus, if the blocking and clamp diodes BD and CD have the same characteristics, the mid point potential Vj is converged to a mid point potential $(Vp+Vdc)/2$ between the drive pulse voltage Vp and clamp voltage Vdc and does not subsequently exceed the constant potential $(Vp+Vdc)/2$ even by increasing the duration, i.e., application time, of the drive pulse Vp.

When the application of the drive pulse Vp is ended, at which time the mid point potential Vj is the constant voltage $(Vp+Vdc)/2$ higher than the clamp voltage Vdc, the capacitance of the photo-diode PD is discharged quickly through the clamp diode CD until the mid point voltage Vj becomes equal to the clamp voltage Vdc. This discharge is quite irrelevant to discharge due to photo-current, that is, it corresponds to an excess extent of charging.

Subsequently, the capacitance of the photo-diode PD is discharged gradually by photo-current generated in accordance with incident light intensity. Denoting the charge which is discharged by the photo-current by $\Delta Q$ and the capacitance of the photo-diode by C, the voltage change $\Delta V$ of the mid point potential Vj from the clamp voltage Vdc after the pulse of the storage time T is given as $$\Delta V = \Delta Q/C$$

Denoting the photo-current by Ip, $$\Delta Q = Ip \cdot T$$

The voltage change $\Delta V$ is thus given as $$\Delta V = IP \cdot T/C$$

Meanwhile, the forward voltage Vf across the blocking diode BD is gradually reduced with gradual increase of the mid point voltage Vj. However, since the mid point potential Vj is clamped at the constant potential (Vp+Vdc)/2, at least a voltage given as $$\begin{aligned} Vf &= Vp - Vj \\ &= Vp - (Vp + Vdc)/2 \\ &= (Vp - Vdc)/2 \end{aligned}$$

is secured.

Figure 5:
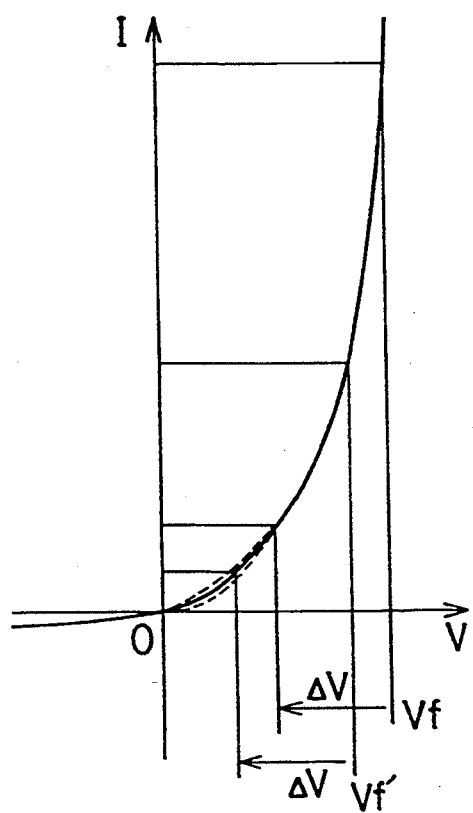
FIG. 5 is a graph showing an V-I characteristic of blocking diode shown in FIGS. 1 to 3.

The voltage change A V of the mid point potential Vj is the same when original of the same light intensity is read out. Thus, as is obvious from the general V-I characteristic of diode as shown in FIG. 5, by securing as high forward voltage Vf across the blocking diode BD as possible, a higher forward current, i.e., a higher charging current, can be secured to permit quicker charging of the capacitance of the photo-diode PD. It is thus possible to permit operation with lower illumination intensity as well as at higher speed and also permit use of a low illumination intensity, low price light source. Further, it is possible to permit use of a lens or like optical system and also permit slightly strong shading correction with an optical system for such purpose as making up for characteristic fluctuations of the photo-diode PD.

Figure 6:
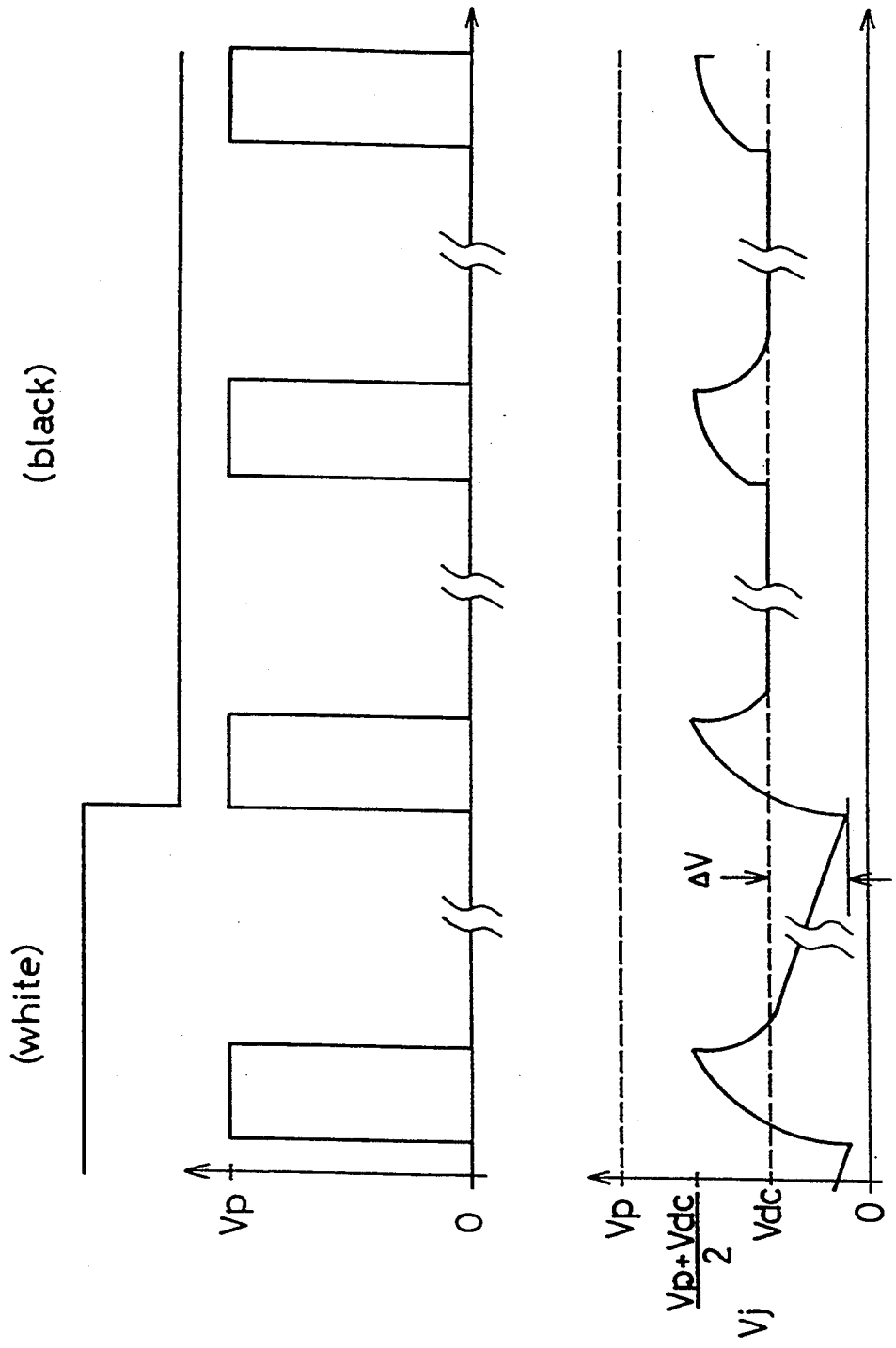
FIG. 6 is a time chart for explaining the effect of the image sensor shown in FIGS. 1 and 2 to eliminate residual image.

Further, a case of original light intensity changing from white to black as shown in FIG. 6 will be considered. First the capacitance of the photo-diode PD, which has been perfectly charged by the first drive pulse Vp, is gradually discharged by photo-current Ip generated by the white part of the original. From this instant, the mid point potential Vj is lower by $\Delta V$ than the clamp voltage Vdc until the application of the next drive pulse Vp. When the next drive pulse Vp is applied, the capacitance of the photo-diode PD is completely discharged again, causing the mid point voltage Vj to be increased to (Vp+Vdc)/2. The capacitance of the photo-diode PD can be said to be completely charged at an instant when the mid point potential Vj becomes equal to the clamp voltage Vdc. This means that the capacitance of the photo-diode PD is in an over-charged state at the instant when the application of the drive pulse Vp is ended. With the next black part of the original, the photo-current Ip is not generated. Thus, the mid point potential Vj is quickly reduced until it becomes equal to the clamp voltage Vdc, then the voltage Vdc is maintained. It is to be appreciated that when the application of the drive pulse Vp is ended, the mid point voltage Vj is always higher than the clamp voltage Vdc, and the capacitance is always in the completely charged state. Thus, unlike the prior art case, there is no possibility that with a black part of original the mid point potential Vj further goes toward the drive pulse voltage Vp to cause residual image in the vertical direction.

Particularly, the present embodiment has substantially the same structure as that in the prior art except for the clamp diodes CD which are connected to the juncture between the photo- and blocking diodes PD and BD. That is, the photo-, blocking and clamp diodes PD, BD and CD can all be formed on the single insulating substrate 10 and also with the same hydrated amorphous silicon a-Si:H. Thus, it is possible to produce an image sensor easily and inexpensively by merely changing mask patterns or the like. Further, the image sensor produced in this way operates stably. Further, since the clamp diodes CD all have their cathode electrodes in common connection, they may be merely connected to a single clamp voltage Vdc, thus simplifying the structure. Thus, the embodiment can overcome the fatal drawbacks inherent in the prior art charge storage type image sensor.

While an embodiment of the image sensor according to the invention has been described, it is by no means limitative and can be modified in various ways.

Figure 7:
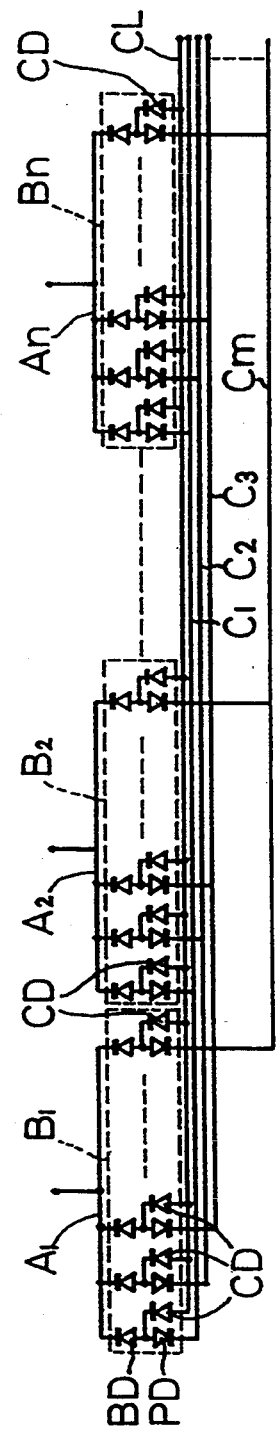
FIG. 7 is a connection diagram showing a different embodiment of the image sensor according to the invention.

FIG. 7 shows a modification of the above embodiment. In this instance, the invention is applied to an image sensor, in which photo- and blocking diodes PD and BD in each diode pair have their anode electrodes connected in series. In this case, clamp diode CD has its cathode electrode connected to the juncture between the photo- and blocking diodes PD and BD. All these clamp diodes CD have their anode electrodes connected commonly to clamp lead CL. The blocking diodes BD have their cathode electrodes connected commonly in individual blocks $B_1, B_2, \ldots, B_n$ by respective block leads $A_1, A_2, \ldots, A_n$. As for the photo-diodes PD, those in like positions in the individual blocks $B_1, B_2, \ldots, B_n$ are connected commonly by respective channel leads $C_1, C_2, \ldots, C_m$. In this modification, the drive pulse Vp has to be negative.

Further, although not shown, the photo- and blocking diodes PD and BD may be interchanged. That is, the electrodes of the photo-diodes PD not connected to the blocking diodes BD (i.e., the anode electrodes in the embodiment shown in FIG. 1 and the cathode electrodes in the embodiment shown in FIG. 7) may be connected commonly in the individual blocks $B_1, B_2, \ldots, B_n$, while connecting the electrodes the blocking diodes BD not connected to the photo-diodes PD (i.e., the anode electrodes in the embodiment of FIG. 1 and the cathode electrodes in the embodiment of FIG. 7) in like positions of the blocks $B_1, B_2, \ldots, B_n$ commonly in the individual blocks.

Figure 8A:
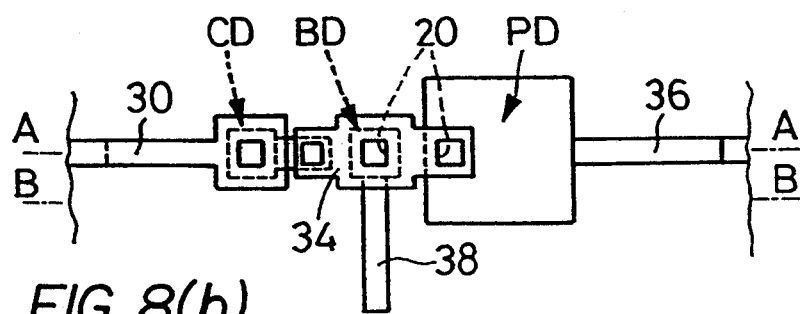
FIGS. 8(a) through 8(c) are schematics showing of a specific structure of the image sensor shown in FIG. 1, (a) being a plan view, (b) being a sectional view taken along line A—A in (a), and (c) being a sectional view taken along line B—B in (a)
Figure 8B:
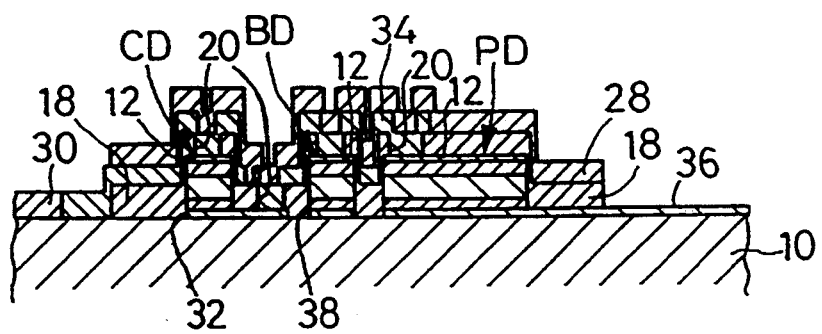
Figure 8C:
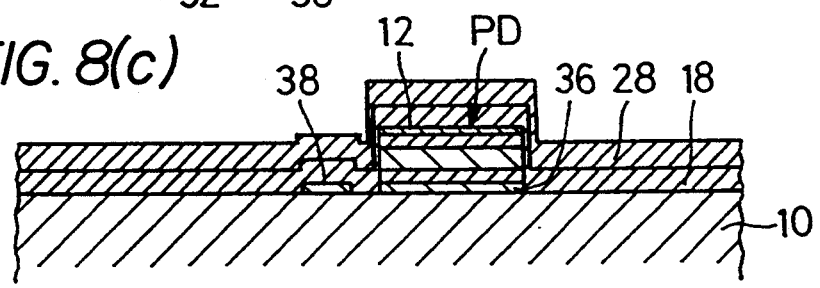

Meanwhile, the specific structure shown in FIG. 2 of the image sensor shown in the connection diagram of FIG. 1 is by no means limitative. For example, as shown in FIG. 8, photo-, blocking and clamp diodes PD, BD and CD may all be formed in the order of a p-, an i- and an n-type from the surface of the insulating substrate 10. In this instance, the clamp diode CD is formed on the outer side of the blocking diode BD. The cathode electrode of the clamp diode CD is connected via its contact hole 20 to upper lead electrode 30, which is in turn connected to a clamp lead (not shown). The anode electrode of the clamp diode CD, on the other hand, is connected to the cathode electrodes of the photo- and blocking diodes PD and BD via inner lead electrode 32 and separate outer lead electrode 34, respectively, and respective contact holes 20. The anode electrode of the photo-diode PD is connected to separate lower lead electrode 36, which is in turn connected to a channel lead (not shown). The anode electrode of the blocking diode BD is further connected to a separate inner lead electrode 38, which is in turn connected to a block lead (not shown).

This image sensor may be manufactured by depositing a metal film for the inner lead electrodes 32, 36 and 38 on the insulating substrate 10, then depositing hydrated amorphous silicon a-Si:H in the order of p-, i- and n-type layers, and then depositing a transparent conductive film for the transparent electrode 12. The manufacture is completed by subsequently repeatedly carrying out patterning by etching and deposition, which will be obvious from the above structure and hence is not described in detail.

Figure 9A:
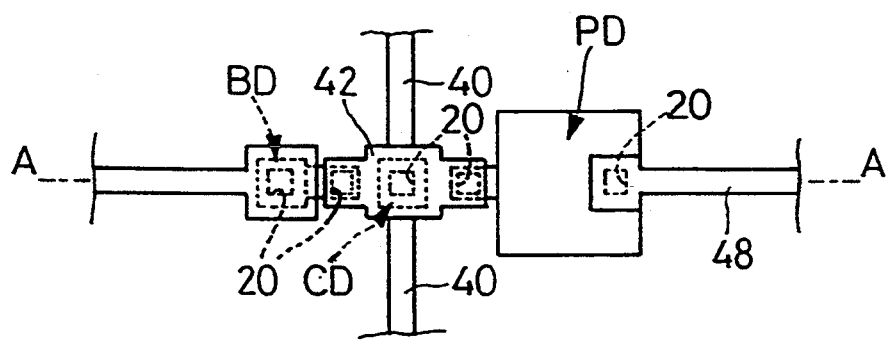
FIGS. 9(a) and 9(b) are schematics showing of a specific structure of the image sensor shown in FIG. 7, (a) being a plan view, (b) being a sectional view taken along line A—A in (a)
Figure 9B:
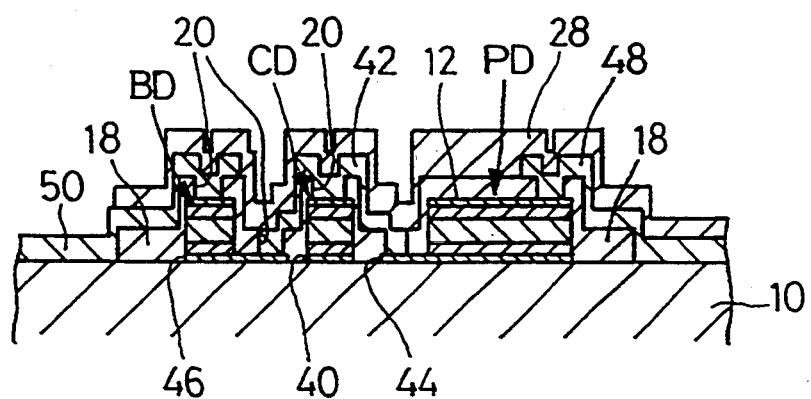

The image sensor shown in FIG. 7 may have a specific structure as shown in FIG. 9. In this instance, clamp diode CD is connected between photo- and blocking diodes PD and BD, and its anode electrode is connected to an inner lead electrode 40 formed underneath it as a clamp lead, which is connected to a common lead. Its cathode electrode is connected to the anode electrode of the photo-diode PD via a contact hole 20, outer lead electrode 42 and separate inner lead electrode 44, and is also connected to the anode electrode of the blocking diode BD via the same outer lead electrode 42 and separate inner lead electrode 46. The cathode electrode of the photo-diode PD is connected to separate outer lead electrode 48, which is in turn connected to a channel lead (not shown). The cathode electrode of the blocking diode BD is connected to separate outer lead electrode 50, which is in turn connected to a block lead (not shown).

While various specific structures have been shown, as the amorphous silicon a-Si constituting the diodes PD, BD and CD may be used not only hydrated amorphous silicon a-Si:H noted above but also hydrated amorphous silicon carbide a-SiC:H and amorphous silicon nitride as well as amorphous silicon a-Si in simply. Further, it is possible to use any semiconductor such as poly-Si, CdS—CdSe, PbS, GaAs and InGaAs. Further, in lieu of the pin or nip type structure, it is possible to adopt the ni, pi, pn, MIS, hetero-junction, homo-junction and Shottkey type structures of combinations thereof. Further, the order of the semiconductor layer lamination may be different with the individual diodes PD, BD and CD. Various further changes and modifications of the specific structure of the image sensor are possible according to the invention.

Figure 10:
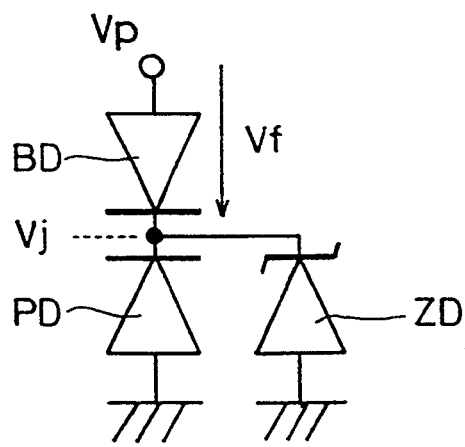
FIG. 10 is a connection diagram showing a part of a further embodiment of the image sensor according to the invention.
Figure 11:
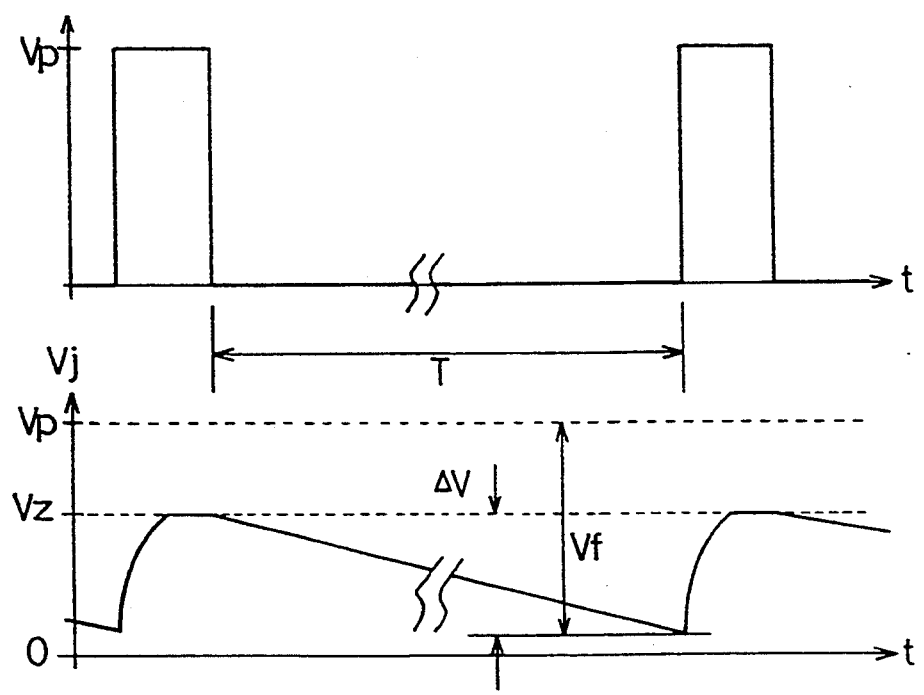
FIG. 11 is a time chart for explaining the operation of the image sensor part shown in FIG. 10.
Figure 12:
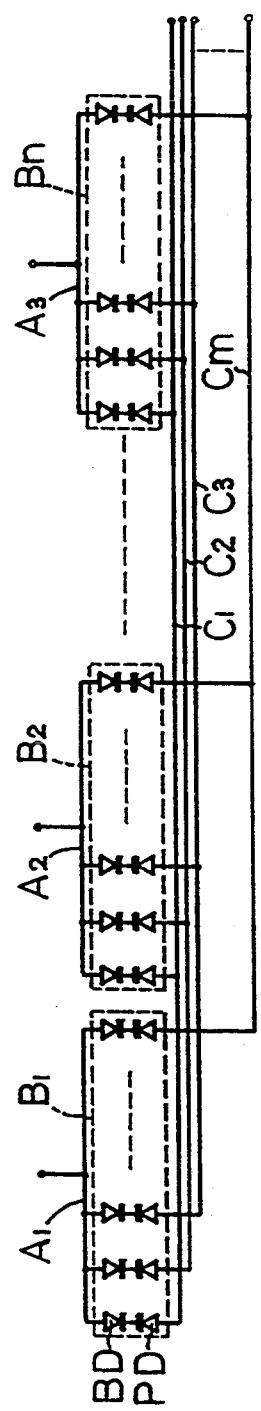
FIG. 12 is a connection diagram showing a prior art image sensor.

FIG. 10 shows a further specific structure of the image sensor. In this instance, Zener diode (clamping means) ZD is connected to the juncture between photo- and blocking diodes PD and BD. So long as this Zener diode ZD has an ideal Zener characteristic, the mid point potential $V_j$ does not exceed the Zener voltage $V_z$. As shown in FIG. 11, when a drive pulse $V_p$ is applied, the capacitance of the photo-diode PD starts to be charged, causing the mid point voltage $V_j$ to be increased toward the drive pulse voltage $V_p$. The mid point potential $V_j$ is increased quickly while it is lower than the Zener voltage $V_z$. When the Zener voltage $V_z$ is reached with the progress of the charging, Zener breakdown commences in the Zener diode ZD, and the mid point potential $V_j$ is no longer changed. That is, as the forward voltage $V_f$ across the blocking diode BD, at least $V_p - V_z$ is secured. Thus, the capacitance of the photo-diode can always be charged completely and quickly. When the application of the drive pulse $V_p$ is ended, the capacitance of the photo-diode PD is gradually discharged by the photo-current. The mid point voltage $V_j$ thus is gradually reduced, and after the lapse of the storage time T it is lower by $\Delta V$ than the Zener diode $V_z$. Thus, by processing the current, which is caused to flow through the photo-diode PD by the application of the drive pulse $V_p$, in a usual signal processing circuit, an image signal can be obtained.

Further, although not shown, the juncture between the photo- and blocking diodes PD and BD may be connected to a low impedance voltage source or the like via a transistor or like switching element (clamping means). In general, any arrangement may be used so long as the mid point voltage $V_j$ is clamped by some means so that it cannot be changed to be above or below a certain value.

While in the above embodiments all the like electrodes of the clamp diodes CD are commonly connected, it is possible as well to lead each of these electrodes to an edge of the insulating substrate 10 to connect it to a fixed clamp voltage $V_{dc}$ independently. In this case, it is possible to make up for fluctuations among the individual photo-diodes PD by setting the clamp voltage $V_{dc}$ according to the characteristic of each photo-diode PD or the like.

Further, instead of forming the clamp diodes CD on the insulating substrate 10 as in the above embodiments, an IC or the like having many diodes arranged in an array may be provided on an edge of the insulating substrate 10 to use these diodes as clamp diodes CD. In this case, the lead electrodes each connecting the photo- and blocking diodes PD and BD in each diode pair may be led to an edge of the insulating substrate 10 and connected to the IC or the like as noted above by means of bonding. It is thus possible to obtain a structure, which is substantially the same as that of the prior art image sensor and is extremely simplified.

In the above description, the number of blocks and the number of photo-diodes or the like in each block are represented by n and m, respectively. With an image sensor having 8 dots per mm for A4 horizontal size (i.e., 216 mm), 1,728 photo-diodes are necessary. In this case, it is possible to set m=32 and n=54 or m=16 and n=108 These numbers are not limitative, and it is possible to set natural numbers independently. For example, if m is set to 1, it means a system, in which a drive pulse is applied independently to each photo-diode. If n is set to 1, it means a system, in which a drive pulse is applied collectively to all the photo-diodes. Further, it is possible to set m=1 and n=1. In this case, the system is a mere photo-sensor rather than an image sensor. Thus, in this specification the image sensor means a concept covering photo-sensors constituted by photo-, blocking and clamp diodes as well.

various further improvements, changes and modifications are possible by the intelligence of one skilled in the art without departing from the scope and spirit of the invention.

What is claimed is:

1. An image sensor comprising:
   a plurality of diode pairs, each diode pair including a photo diode and a blocking diode connected in series, one of an anode and cathode electrode of said photo diode being connected to an equivalent electrode of said blocking diode, wherein:
   a first remaining diode pair electrode not being used to attach said photo diode to said blocking diode is connected to an equivalent electrode of another diode pair in a same block, and
   a second remaining diode pair electrode not being used to attach said photo diode to said blocking diode is connected to an equivalent electrode of another diode pair located in a similar position in another block; and
   means for clamping an electric potential at a junction between said photo diode and blocking diode in each of said diode pairs.

2. The image sensor according to claim 1, wherein said clamping means is a clamp diode connected to said junction between said photo diode and blocking diode with an electrode opposite of the kind constituting the junction between said photo diode and blocking diode.

3. The image sensor according to claim 2, wherein an electrode of said clamp diode not being connected to said junction between said photo diode and blocking diode is commonly connected to similar electrodes of other clamp diodes.

4. The image sensor according to one of claims 2 or 3, wherein said photo diode, blocking diode and clamp diode are all formed on a single insulating substrate.

5. The image sensor according to one of claims 2 to 4, wherein said photo diode, blocking diode and clamp diode are all made of amorphous silicon.

6. An image sensor comprising:
   a plurality of diode pairs arranged in an array so as to form n blocks (B1, B2 ... Bn), each block having m diode pairs, each pair including a photo diode and a blocking diode connected in series by connecting a cathode electrode of said photo diode to a cathode electrode of said blocking diode; wherein
   an anode electrode of each blocking diode in each of said m diode pairs of a block being connected to one another by means of a block lead, with respective block leads (A1, A2 ... An) provided for each of said blocks, and
   each anode electrode of said photo diode in each of said m diode pairs of a first block (B1) being connected, by respective channel leads (C1, C2 ... Cm), to anode electrodes of photo diodes positioned in a same respective location in subsequent blocks (B2, B3 ... Bn); and
   a clamp diode is connected to each junction formed between said photo diode and blocking diode in each of said diode pairs; wherein
   an anode electrode of said clamp diode is connected to said junction formed between said photo diode and blocking diode, and
   a cathode electrode of each clamp diode is connected to one another by means of a clamp lead.

7. An image sensor comprising:
   a photo diode;
   a blocking diode;
   a clamp diode;
   a first inner lead electrode for connecting a cathode electrode of said photo diode and blocking diode;
   a second inner lead electrode for connecting a cathode electrode of said clamp diode to a clamp lead;
   a first outer lead electrode for connecting an anode electrode of said photo diode to a channel line through a contact hole formed in a transparent insulating film;
   a second outer lead electrode for connecting an anode electrode of said blocking diode to a blocking lead; and
   a third outer lead electrode for connecting an anode electrode of said clamp diode to said first inner lead electrode,
   said photo diode, said blocking diode and said clamp diode all being arranged substantially in a row and formed on a single insulating substrate, having an electrode, an amorphous silicon layer and a transparent electrode, said amorphous silicon layer having the same structure for each diode and said transparent electrode being formed on an outermost sub-layer of said amorphous silicon layer.

8. An image sensor comprising:
   a photo diode;
   a blocking diode;
   a clamp diode;
   a first inner lead electrode for connecting a cathode electrode of said photo diode and blocking diode;
   a first outer lead electrode for connecting a cathode electrode of said clamp diode to a clamp lead through a contact hole formed in a transparent insulating film;
   a second inner lead electrode and a second outer lead electrode for connecting an anode electrode of said clamp diode to the cathode electrodes of said photo diode and blocking diode through contact holes;
   a third inner lead electrode for connecting an anode electrode of said photo diode to a channel lead; and
   a fourth inner lead electrode for connecting an anode electrode of said blocking diode to a blocking lead,
   said photo diode, said blocking diode and said clamp diode all being arranged substantially in a row and formed on a single insulating substrate, having an electrode, an amorphous silicon layer and a transparent electrode, said amorphous silicon layer having the same structure for each diode and said transparent electrode being formed on an outermost sub-layer of said amorphous silicon layer.

* * * * *